United States Patent [19]
Korenaga et al.

[11] Patent Number: 5,537,186
[45] Date of Patent: Jul. 16, 1996

[54] MOVABLE STAGE MECHANISM AND EXPOSURE APPARATUS USING THE SAME

[75] Inventors: Nobushige Korenaga, Sagamihara; Ryuichi Ebinuma, Machida, both of Japan

[73] Assignee: Canon Kabushiki Kaisha, Tokyo, Japan

[21] Appl. No.: 282,328

[22] Filed: Jul. 29, 1994

[30] Foreign Application Priority Data

Aug. 3, 1993 [JP] Japan .................................... 5-210999
Dec. 22, 1993 [JP] Japan .................................... 5-324965

[51] Int. Cl.⁶ .......................... G03B 27/42; H01L 21/02
[52] U.S. Cl. ......................................................... 355/53
[58] Field of Search .................................. 355/53, 72, 75

[56] References Cited

U.S. PATENT DOCUMENTS 4,769,680 9/1988 Resor, III et al. ..................... 355/43
5,073,912 12/1991 Kobayashi et al. ..................... 378/34

Primary Examiner—Fred L. Braun
Attorney, Agent, or Firm—Fitzpatrick, Cella, Harper & Scinto

[57] ABSTRACT

A movable stage apparatus suitable for a semiconductor exposure apparatus or the like has a stage, a first driving mechanism for moving the stage in a predetermined direction, and a second driving mechanism for moving the stage by a minute amount in the predetermined direction. One of the mover and stator of the second driving mechanism is substantially fixed to the stage and the other is substantially movable with the movement of the stage by the first driving mechanism.

12 Claims, 12 Drawing Sheets

MOVABLE STAGE MECHANISM AND EXPOSURE APPARATUS USING THE SAME

BACKGROUND OF THE INVENTION

1. Field of the Invention

This invention relates to a positioning stage apparatus for use in a semiconductor exposure apparatus, a precision machine tool, a precision measuring machine or the like, and an exposure apparatus using the same.

2. Related Background Art

In a semiconductor exposure apparatus, a precision machine tool, a precision measuring machine, etc., it is required to highly accurately position a substrate such as a wafer to be exposed, a workpiece or an object to be measured. For this purpose, there has been developed a positioning stage apparatus in which a holding board for holding a substrate or a workpiece is kept in non-contact with a guide surface for guiding it by a hydrostatic bearing device and a linear motor is used as a driving device for moving the holding board, whereby the accuracy and speed of positioning are improved. An example of such a positioning stage apparatus according to the prior art is shown in FIG. 15 of the accompanying drawings.

The positioning stage apparatus $E_0$ of FIG. 15 is a vertical type positioning stage apparatus for use in an X-ray exposure apparatus using X-rays such as synchrotron radiation as exposure light, and comprises an x stage 102 guided by an x guide 102a integral with a base 101 and reciprocally movable in one direction in a horizontal plane (hereinafter referred to as "x-direction"), a y stage 103 guided by a y guide 103a integral with the x stage 102 and reciprocally movable in a vertical direction (hereinafter referred to as "y-direction"), a wafer chuck 104 provided on the y stage 103, an x electric cylinder 105 for moving the x stage in x-direction, an x linear motor 106 for moving the x stage 102 by a minute amount in x-direction, a y electric cylinder 107 for moving the y stage 103 in y-direction, a y linear motor 108 for moving the y stage 103 by a minute amount in y-direction, and a constant tension spring 109 for offsetting the weight of the y stage 103 by the tension thereof. The rod 105a of the x electric cylinder 105 is connected to the x stage 102 through an x gap joint 105b, and the rod 107a of the y electric cylinder 107 is connected to the y stage 103 through a y gap joint 107b.

The x gap joint 105b comprises a striking plate 105c provided integrally on the free end of the rod 105a of the x electric cylinder 105, and a pair of L-shaped members 105d protruding from a side of the x stage 102. The striking plate 105c is loosely fitted in a gap formed between the side of the x stage 102 and the restraining portion 105e of each L-shaped member 105d opposed thereto, and the dimension of said gap is several microns to several tens of microns. When the rod 105a of the x electric cylinder 105 moves forward in response to a command signal from a command line, not shown, the striking plate 105c bears against the x stage 102 and moves it forward, and when the rod 105a of the x electric cylinder 105 moves backward, the striking plate 105c comes into engagement with the restraining portion 105e of each L-shaped member 105d and retracts the x stage 102. Thereby, the x stage 102 is moved to several microns short of an x-direction command position based on the aforementioned command signal. The y gap joint 107b is likewise constructed.

The x linear motor 106 comprises a stator 106a integral with the base 101 and a small mover 106b integral with the x stage 102, and the y linear motor 108 likewise comprises a stator 108a integral with the x stage 102 and a small mover 108b integral with the y stage 103. Each of the stators 106a and 108a, as shown in FIG. 16 of the accompanying drawings, comprises a number of coils $C_0$ held on a long coil holding member $H_0$, and produces a thrust in each of the movers 106b and 108b by a change in magnetic field when an electric current is supplied to each coil $C_0$, and as previously described, the x stage 102 and the y stage 103 are moved by the driving of the x electric cylinder 105 and the y electric cylinder 107, and each of the stators is provided with a current switching device for detecting the new position of each mover 106b, 108b and supplying an electric current to a predetermined coil when each mover 106b, 108b moves with the x stage or the y stage.

The wafer chuck 104 has a vertical adsorbing surface 104a which adsorbs a wafer $W_0$ by its vacuum adsorbing force. The position of the wafer chuck 104 in the x-direction is monitored by an x interferometer which receives reflected light from an x mirror, not shown, provided on the y stage 103, and the output thereof is negatively fed back to an x servo calculator, not shown, which drives the x linear motor 106 on the basis of the difference between the command signal transmitted from the command line and the output of the x interferometer to thereby move the x stage 102 by a minute amount. Also, the position of the wafer chuck 104 in the y-direction is monitored by a y interferometer, not shown, which receives reflected light from a y mirror provided on the y stage 103, and the output thereof is negatively fed back to a y servo calculator, not shown, which drives the y linear motor 108 to thereby move the y stage 103 by a minute amount. Such fine movement adjustment by the x linear motor 106 and y linear motor 108 is effected after as previously described, the x stage 102 and y stage 103 are moved to several microns short of the command positions based on the respective command signals by the x electric cylinder 105 and y electric cylinder 107, respectively, whereby the y stage 103 is finally positioned.

Each of the x electric cylinder 105 and y electric cylinder 107, as shown in FIG. 17 of the accompanying drawings, comprises a motor M with a water jacket, a gear train G, a screw rod R rotatably supported by a bearing B, and a nut N axially moved by the screw rod R. The nut N is provided integrally with the rod 105a and 107a of the x electric cylinder 105 and the y electric cylinder 107, respectively, and the rotation of the motor M is transmitted to the screw rod R through the gear train G so that the nut N may be moved forward and backward by the rotation of the screw rod R. The motor M has a water jacket as previously described and therefore, there is no possibility of the temperature of the x stage 102 and y stage 103 rising due to the heating of the motor. Also, the x linear motor 106 and y linear motor 108 are used only for positioning servo and do not effect the acceleration and deceleration of the stages, and therefore the amount of heat generated therein is very small and compact design is possible as previously described. The positioning stage apparatus $E_0$ thus prevents the reduction in the accuracy of positioning caused by the heating of the driving devices for the x stage 102 and y stage 103 to the utmost and also realizes the highly accurate and highly responsive positioning by the linear motors.

SUMMARY OF THE INVENTION

However, according to the prior art described above, as shown in FIG. 16, the stator of each linear motor has a number of coils and it is necessary to detect the position of each mover and select a predetermined coil when the mover of each linear motor moves to a new position, and supply an electric current to the predetermined coil and therefore, it is necessary to provide a position sensor for detecting the position of the mover and a complicated current switching device for selecting a coil on the basis of the output of the position sensor and supplying an electric current to the selected coil, and the entire positioning stage apparatus unavoidably becomes bulky and complicated.

The present invention has been made in view of the above-noted problem peculiar to the prior art and has as its primary object the provision of a positioning stage apparatus which does not require a plurality of coils in linear motors for fine movement adjustment.

To achieve the above object, the positioning stage apparatus of the present invention has a movable bed reciprocally movable in a predetermined axial direction along guide means, first driving means for moving said movable bed in said axial direction, and second driving means comprising a linear motor for moving said movable bed by a minute amount in said axial direction, and is characterized in that one of the mover and stator of said linear motor is provided integrally with said movable bed and the other of the mover and stator moves when said movable bed is moved by said first driving means.

According to the above-described apparatus, the movable bed is moved to near a desired position by the first driving means, whereafter fine movement adjustment is effected by the second driving means. When the movable bed is moved by the first driving means, the mover and stator of the linear motor also move therewith and therefore, the coil of the linear motor need not be plural. As a result, a position sensor and a current switching device for selecting a coil are not required.

DETAILED DESCRIPTION OF THE PREFERRED EMBODIMENTS

Some embodiments of the present invention will hereinafter be described with reference to the drawings.

[Embodiment 1]

Figure 1:
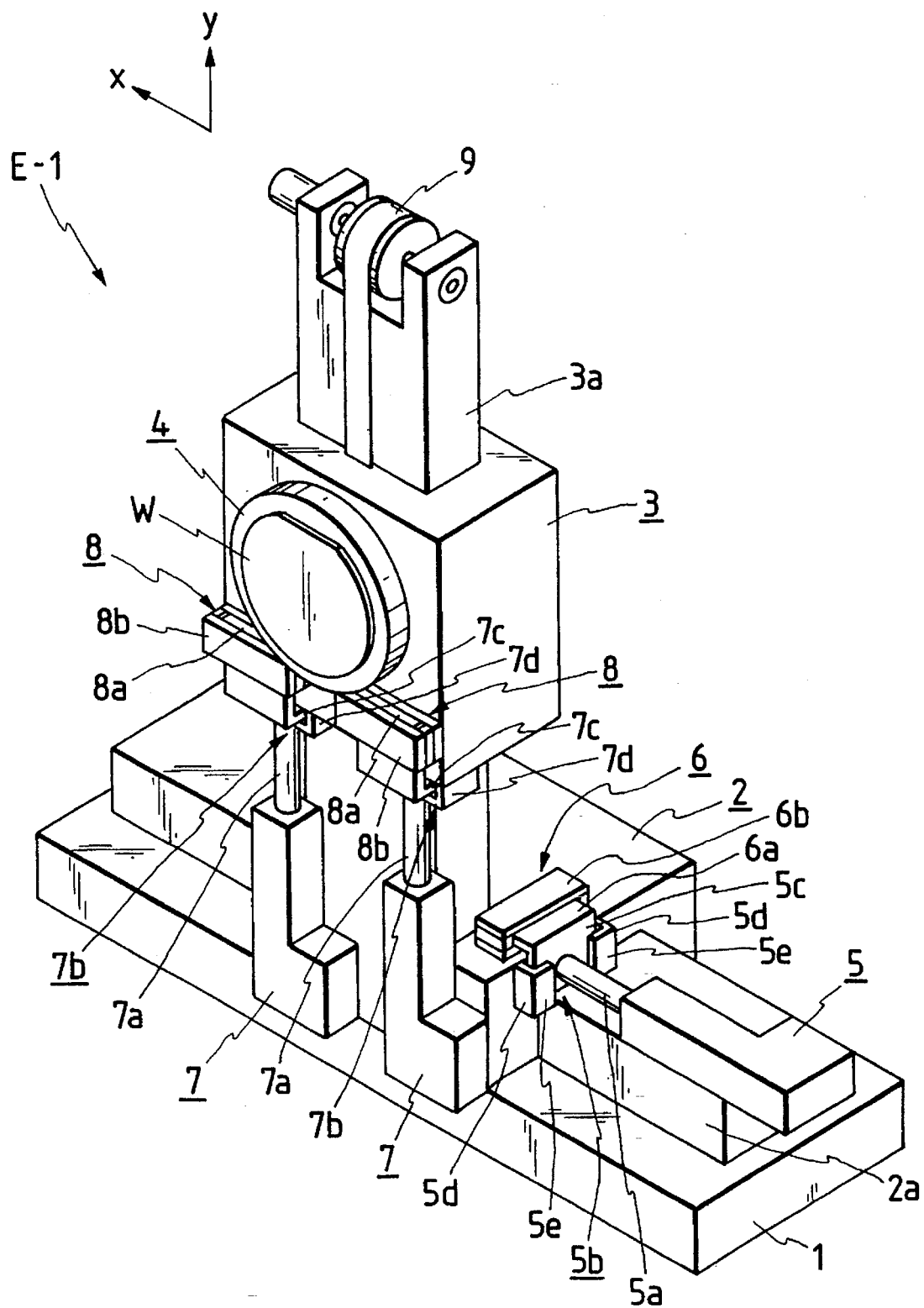
FIG. 1 is a perspective view showing a positioning stage apparatus according to a first embodiment of the present invention.

Referring to FIG. 1 which is a schematic perspective view showing a positioning stage apparatus according to a first embodiment of the present invention, the exposure apparatus of the present embodiment is an X-ray exposure apparatus having exposure means using X-rays such as synchrotron radiation as exposure light. A vertical type positioning stage apparatus E-1 shown in FIG. 1 comprises an x stage 2 which is a movable bed guided by an x guide 2a which is guide means integral with a base 1 and reciprocally movable in one direction in a horizontal plane (hereinafter referred to as "x-direction), a y stage 3 which is a movable bed guided by a y guide 3a which is guide means integral with the x stage 2 and reciprocally movable in a vertical direction (hereinafter referred to as "y-direction"), a wafer chuck 4 provided on the y stage 3, an x electric cylinder 5 which is first driving means for moving the x stage 2 in x-direction, an x linear motor 6 which is second driving means for moving the x stage 2 by a minute amount in the x-direction, y electric cylinders 7 which are a pair of first driving means for moving the y stage in y-direction, y linear motors 8 which are a pair of second driving means for moving the y stage 3 by a minute amount in the y-direction, and a constant tension spring 9 for offsetting the weight of the y stage 3 by its tension. The rod 5a of the x electric cylinder 5 is connected to the x stage 2 through an x gap joint 5b, and the rod 7a of each y electric cylinder 7 is connected to the y stage 3 through a y gap joint 7b.

The x gap joint 5b comprises a striking plate 5c which is contacting means integrally provided on the free end of the rod 5a of the x electric cylinder 5, and a pair of L-shaped members 5d protruding from a side of the x stage 2. The striking plate 5c is loosely fitted in a gap formed between a side of the x stage 2 and the restraining portion 5e of each L-shaped member 5d opposed thereto, and the dimension of the gap is several microns to several tens of microns. When the rod 5a of the x electric cylinder 5 moves forward in response to a command signal from a command line, not shown, the striking plate 5c bears against the x stage 2 and moves it forward, and when the rod 5a of the x electric cylinder 5 moves backward, the striking plate 5c comes into engagement with the restraining portions 5e of the L-shaped members 5d to thereby move the x stage 2 backward. The x electric cylinder 5 thus moves the x stage 2 to several microns short of an x-direction command position based on the aforementioned command signal.

Each y gap joint 7b is similar to the x gap joint 5b, and comprises a striking plate 7c which is contacting means, and a pair of L-shaped members 7d.

The x linear motor 6 comprises a stator 6a integral with the striking plate 5c of the x gap joint 5b, and a small mover 6b integral with the x stage 2, and each y linear motor 8 likewise comprises a stator 8a integral with the striking plate 7c of the y gap joint 7b, and a small mover 8b integral with the y stage 3.

Figure 2:
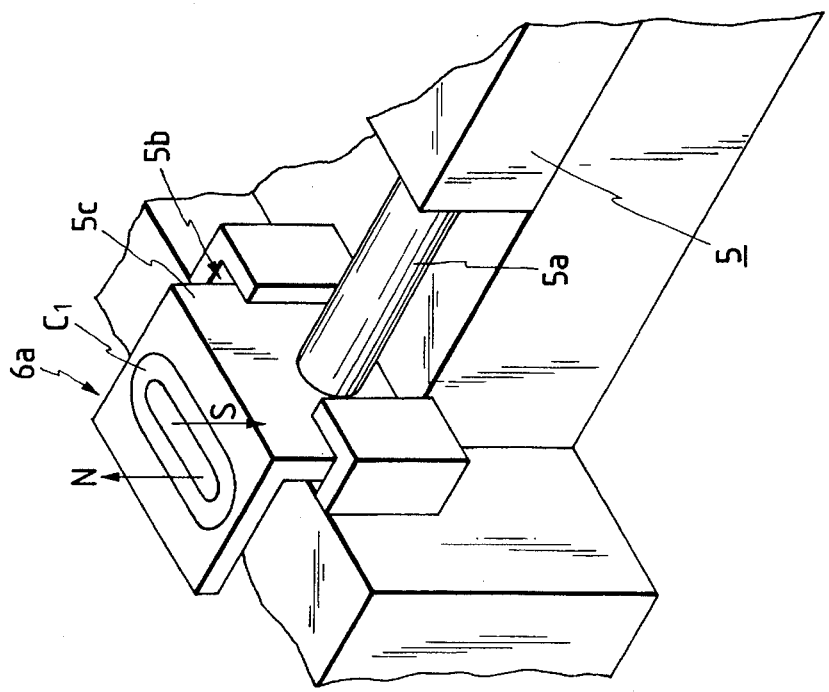
FIG. 2 is an enlarged fragmentary perspective view enlargedly showing the stator of the x linear motor of the apparatus of FIG. 1 and the connecting portion thereof.

The stator 6a of the x linear motor 6, as enlargedly shown in FIG. 2, comprises coil $C_1$ coupled integrally to the striking plate 5c of the x gap joint 5b, and moves with the x stage 2 when as previously described, the x stage 2 is moved by the driving of the x electric cylinder 5. The stator 8b of each y linear motor 8 likewise comprises a coil coupled integrally to the striking plate 7c of the y gap joint 7b, and moves with the y stage 3 when the y stage 3 is moved by the driving of each y electric cylinder 7. That is, unlike the stator of the prior art in which a number of coils are disposed in series, each stator 6a, 8a in the present embodiment comprises a coil and is designed such that when the x electric cylinder 5 and the y electric cylinder 7 are driven, the coil is moved to several microns short of the respective command positions of the x stage 2 and y stage 3, with the movers 6b and 8b, and therefore a position sensor for detecting the positions of the movers 6b and 8b and a current switching device for selecting and exciting a coil are not required and accordingly, with the movers 6b and 8b, the stators 6a and 8b can be made very small and moreover, it greatly contributes to the simplification of the apparatus.

The wafer chuck 4 has a vertical adsorbing surface 4a which adsorbs a wafer W by its vacuum adsorbing force. The position of the wafer chuck 4 in the x-direction is monitored by an x interferometer which receives reflected light from an x mirror, not shown, provided on the y stage 3, and the output thereof is negatively fed back to an x servo calculator, not shown, which drives the x linear motor 6 on the basis of the difference between the command signal transmitted from the command line and the output of the x interferometer to thereby move the x stage 2. Also, the position of the wafer chuck 4 in the y-direction is monitored by a y interferometer, not shown, which receives reflected light from a y mirror provided on the y stage 3, and the output thereof is negatively fed back to a y servo calculator, not shown, which drives each y linear motor 8 to thereby move the y stage 3.

Each of the x electric cylinder 5 and y electric cylinders 7, as in the example of the prior art, comprises a motor with a water jacket, not shown, a gear train, a screw rod rotatably supported by a bearing, and a nut axially moved by the screw rod. The nut is provided integrally with the rods 5a and 7a of the x electric cylinder 5 and the y electric cylinders 7, respectively, and design is made such that the rotation of the motor is transmitted to the screw rod through the gear train and the nut is moved forward or backward by the rotation of the screw rod, and there is no possibility of the temperatures of the x stage 2 and y stage 3 rising due to the heating of the motor. Also, the x linear motor 6 and each y linear motor 8 are used only for positioning servo and do not effect the acceleration and deceleration of the stage and therefore, the amount of heat generated therein is very small and compact design can be made as previously described. The positioning stage apparatus E-1 thus prevents the reduction in the accuracy of positioning caused by the driving devices for the x stage and y stage to the utmost, and realizes the highly accurate and highly responsive positioning by the linear motors and also, the downsizing and simplification of the positioning stage apparatus are greatly expedited by the downsizing of the stator of each linear motor and the elimination of a position sensor and a current switching device.

[Embodiment 2]

Figure 3:
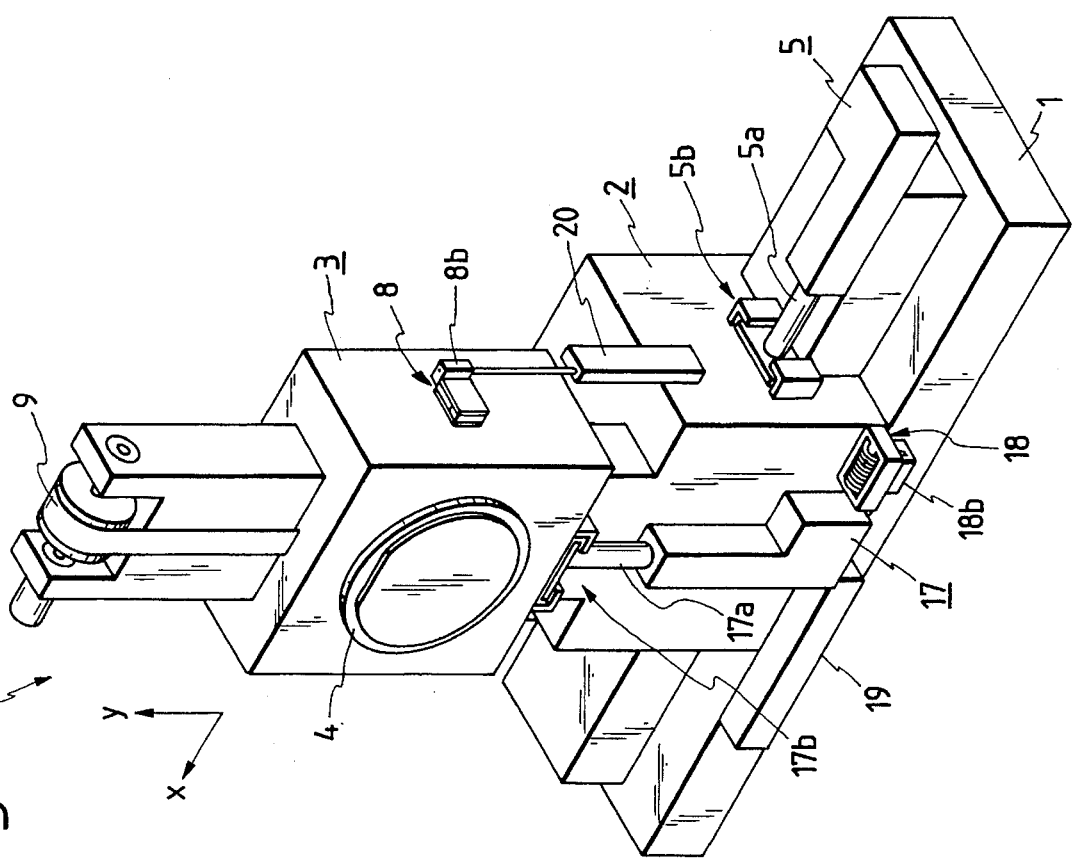
FIG. 3 is a perspective view showing a positioning stage apparatus according to a second embodiment of the present invention.

Referring to FIG. 3 which shows a second embodiment of the present invention, a positioning stage apparatus E-2 according to this embodiment is one in which in lieu of the y electric cylinders 7 in the first embodiment, a larger y electric cylinder 17 is used and the rod 17a thereof is connected to the y stage 3 by a y gap joint 17b and in lieu of the x linear motor 6 for fine movement adjustment, a voice coil motor 18 which is a linear motor is provided and use is made of an x auxiliary cylinder 19 and a y auxiliary cylinder 20 which are third driving means for moving the stator 18b of the voice coil motor 18 and the stator 8b of the y linear motor 8 in the x-direction and the y-direction, respectively. The x auxiliary cylinder 19 is driven in synchronism with the x electric cylinder 5 by the same amount in the same direction as the latter, and the y auxiliary cylinder 20 is driven in synchronism with the y electric cylinder 17 by the same amount in the same direction as the latter. The base 1, the x stage 2, the y stage 3, the wafer chuck 4, the x electric cylinder 5, the rod 5a thereof, the x gap joint 5b, the y linear motor 8 and the constant tension spring 9 are the same as those in the first embodiment and therefore need not be described. In this present embodiment, it is not necessary to limit the mounted positions of the movers of the y linear motor 8 and voice coil motor 18 and therefore, optimum mounted positions can be chosen with the vibration preventing effect or the like during the driving of the y linear motor 8 and voice coil motor 18 taken into account.

Figure 4:
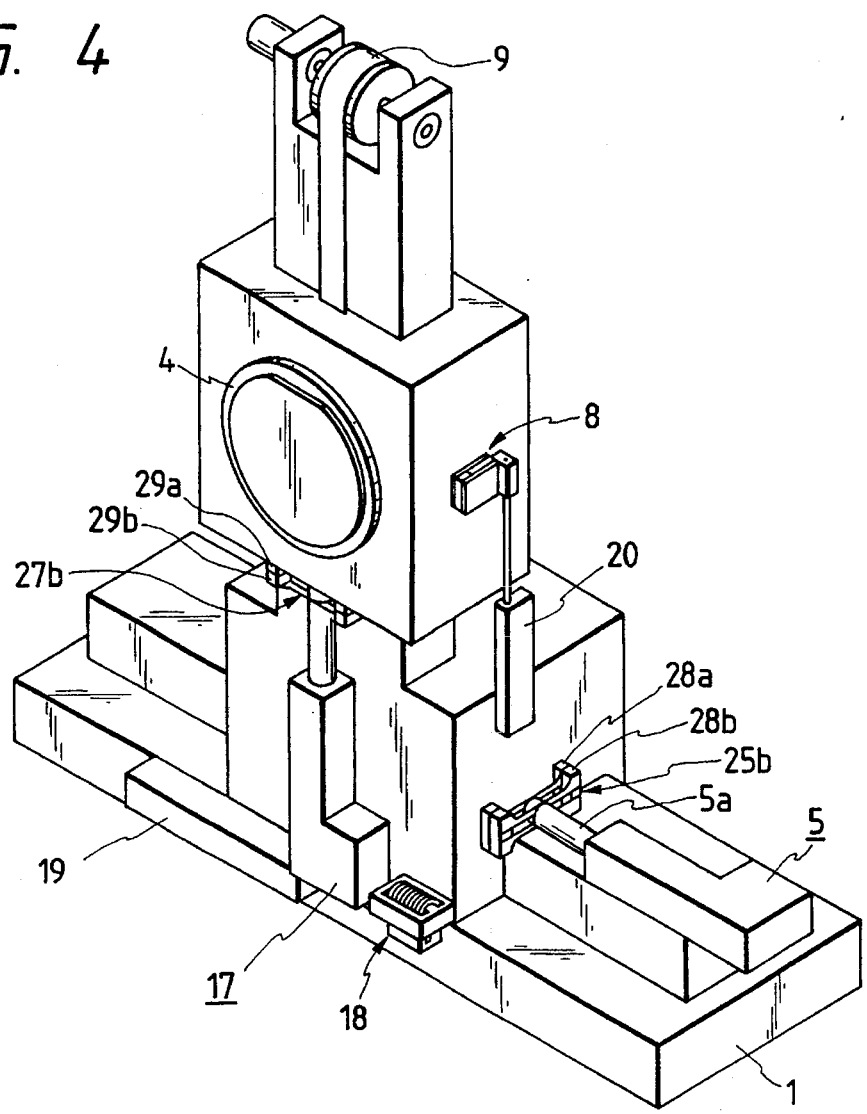
FIG. 4 is a perspective view showing a modification of the positioning stage apparatus according to the second embodiment.

FIG. 4 shows a modification of the second embodiment. In this modification, an x spring joint 25b and a y spring joint 27b each comprising a pair of parallel springs are used instead of the x gap joint 5b for connecting the rod 5a of the x electric cylinder 5 in the second embodiment to the x stage 2 and the y gap joint 17b for connecting the rod 17a of the y electric cylinder 17 to the y stage 3. That is, the x spring joint 25b comprises a pair of parallel springs 28a and 28b for holding the free end of the rod 5a of the x electric cylinder 5 therebetween, and these springs are held on the x stage 2 and the rod 5a of the x electric cylinder 5 is designed to be reciprocally finely movable in the x-direction relative to the x stage 2 within a range permitted by the resiliency of the parallel springs 28a and 28b. The y spring joint 27b likewise comprises a pair of parallel springs 29a and 29b and the rod 17a of the y electric cylinder 17 is designed to be reciprocally finely movable in the y-direction relative to the y stage 3 within a range permitted by the resiliency of these springs 29a and 29b.

[Embodiment 3]

Figure 5:
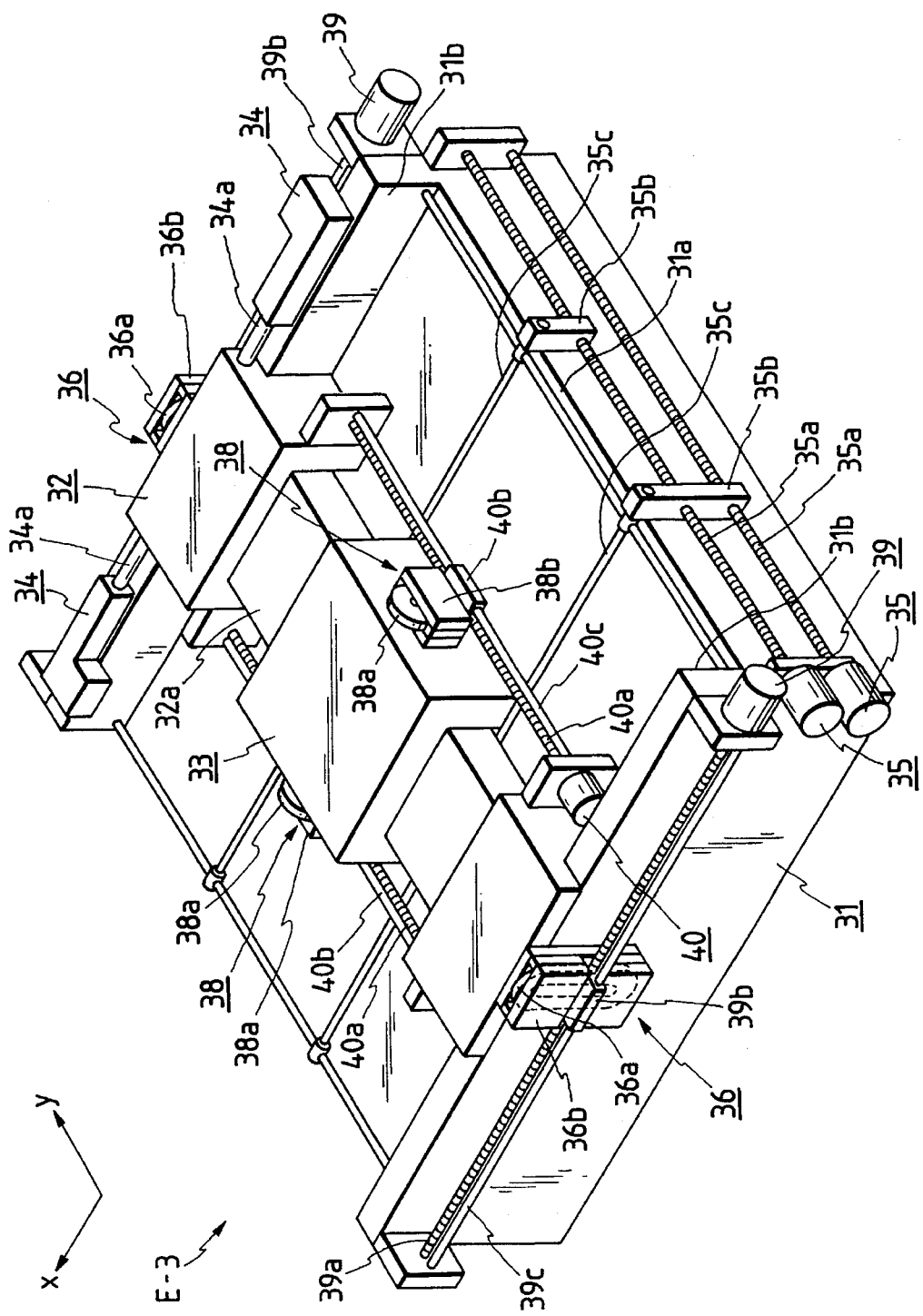
FIG. 5 is a perspective view showing a positioning stage apparatus according to a third embodiment of the present invention.

Referring to FIG. 5 which shows a positioning stage apparatus according to a third embodiment of the present invention, the exposure apparatus of this embodiment is a reduction projection type exposure apparatus (stepper) having exposure means for exposing a substrate such as a wafer, not shown, while holding it horizontally. The positioning stage apparatus E-3 of FIG. 5 comprises a base 31 having a horizontal guide surface 31a and guides 31b which are a pair of guide means extending in a predetermined direction (hereinafter referred to as "X-direction") along the guide surface 31a, an X stage 32 which is a movable bed supported in non-contact on the guide surface 31a by a hydrostatic bearing, not shown, and reciprocally movable along the guides 31b, and a Y stage 33 which is a movable bed reciprocally movable in the Y-direction orthogonal to the X-direction along the guide surface which is guide means for the X stage 32, and a substrate such as a wafer is adsorbed by an adsorbing surface provided on the upper surface of the Y stage 33. The X stage 32 is moved in the X-direction by X electric cylinders 34 which are a pair of first driving means driven alternately or in opposite directions. That is, a rod 34a which is the contacting means of each X electric cylinder 34 bears against each end surface of the X stage 32 in X-direction, and the X stage 32 is designed to be moved forward in X-direction by the drive force of one X electric cylinder 34 and be moved backward by the drive force of the other X electric cylinder 34. Also, a driving device for moving the Y stage 33 in the Y-direction by the X stage 32 has striking bars 35c which are a pair of contacting means adapted to bear against the end surfaces of the Y stage 33 in the Y-direction, the striking bars 35c are moved in the Y-direction by the rotation of screw rods 35a which are rotated by Y motors 35 which are first driving means rotatively driven in opposite directions. That is, the Y stage 33 is moved forward in the Y-direction by the drive force of one Y motor 35 and is moved backward by the drive force of the other Y motor 35.

The X stage 32 and Y stage 33 hold the movers 36b and 38b, respectively, of X linear motors 36 and Y linear motors 38 which are second diving means provided in pairs for fine movement adjustment, and the stator 36a of each X linear motor 36 comprises a coil and is designed to be moved by the same amount in the same direction with the movement of the X stage 32 by an X auxiliary motor 39 which is third driving means driven in synchronism with each X electric cylinder 34, and the stator 38a of each Y linear motor 38 likewise comprises a coil and is designed to be moved by the same amount in the same direction with the movement of the Y stage 33 by a Y auxiliary motor 40 which is third driving means driven in synchronism with each Y motor 35.

Figure 6:
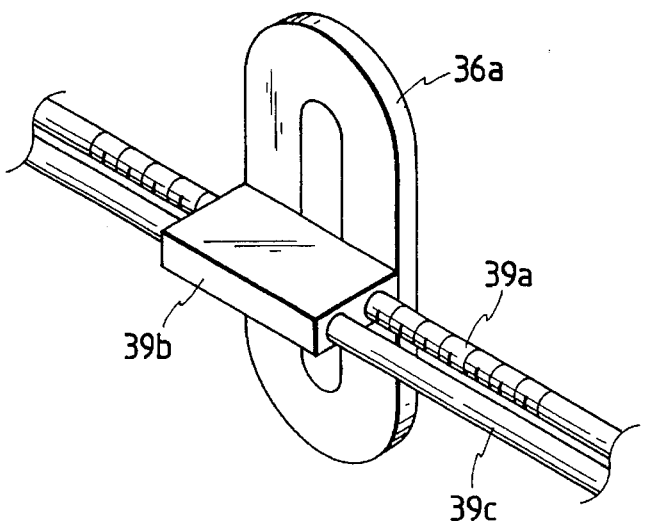
FIG. 6 is an enlarged fragmentary perspective view enlargedly showing the stator of the x linear motor of the apparatus of FIG. 5 and the connecting portion thereof.

Referring to FIG. 6 which enlargedly shows only the stator 36a of one X linear motor 36, the stator 36a is integral with a nut member 39b threadably engaged with a screw rod 39a rotated by the X auxiliary motor 39, and the nut member 39b slides along a guide bar 39c disposed parallel to the screw rod 39a. The stator 38a of each Y linear motor 38 is likewise integral with a nut member 40b threadably engaged with a screw rod 40a rotated by the Y auxiliary motor 40 and moving along a guide bar 40c.

As in the first embodiment, the X linear motors 36 and Y linear motors 38 are driven after the X stage 32 and Y stage 33 are moved to several microns short of respective command positions by the driving of the X electric cylinder 34 and Y motor 35 based on a predetermined command signal, thereby effecting final fine movement adjustment. The stators 36a and 38a of each X linear motor 36 and each Y linear motor 38 are moved in synchronism with the X stage 32 and Y stage 33, respectively, by the same amounts in the same directions as the X stage and the Y stage, and therefore it is not necessary to provide a plurality of coils as in the example of the prior art.

Figure 7:
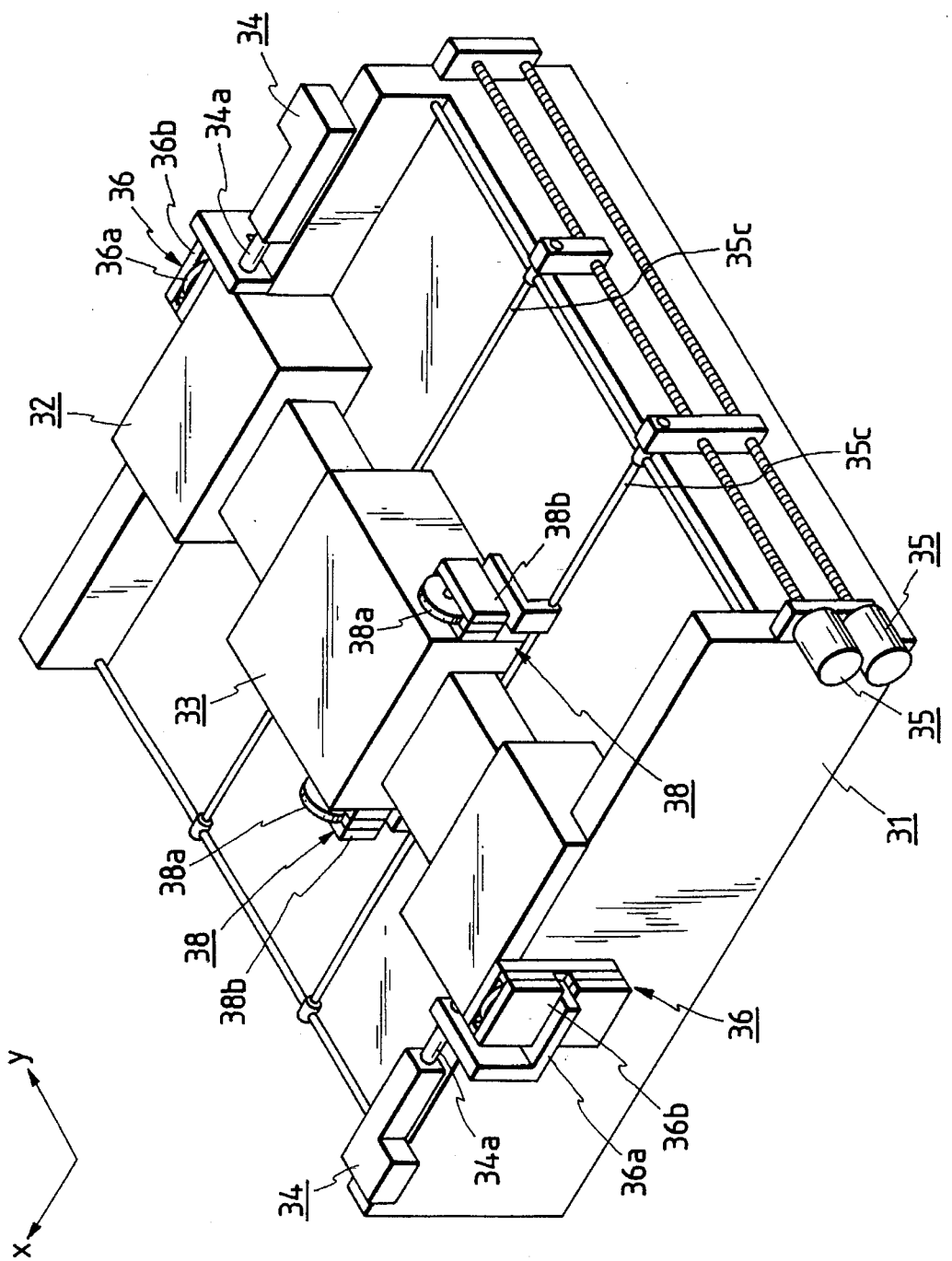
FIG. 7 is a perspective view showing a modification of the positioning stage apparatus according to the third embodiment.

FIG. 7 shows a modification of the present embodiment. In this modification, the stator 38a of each Y linear motor 38 is provided integrally with a striking bar 35c driven by one Y motor 35 and the stator 36a of each X linear motor 36 is provided integrally with the rod 34a of each X electric cylinder 34. This modification does not require auxiliary motors for driving the stators 36a and 38a, but yet suffers from the limitation that the mounted positions of the stators 36a and 38a with respect to the X stage 32 and Y stage 33 are limited to a very narrow range and the X electric cylinders 34 for driving the X stage in X-direction need be dispersed and disposed on both sides of the X stage 32.

[Embodiment 4]

Figure 8:
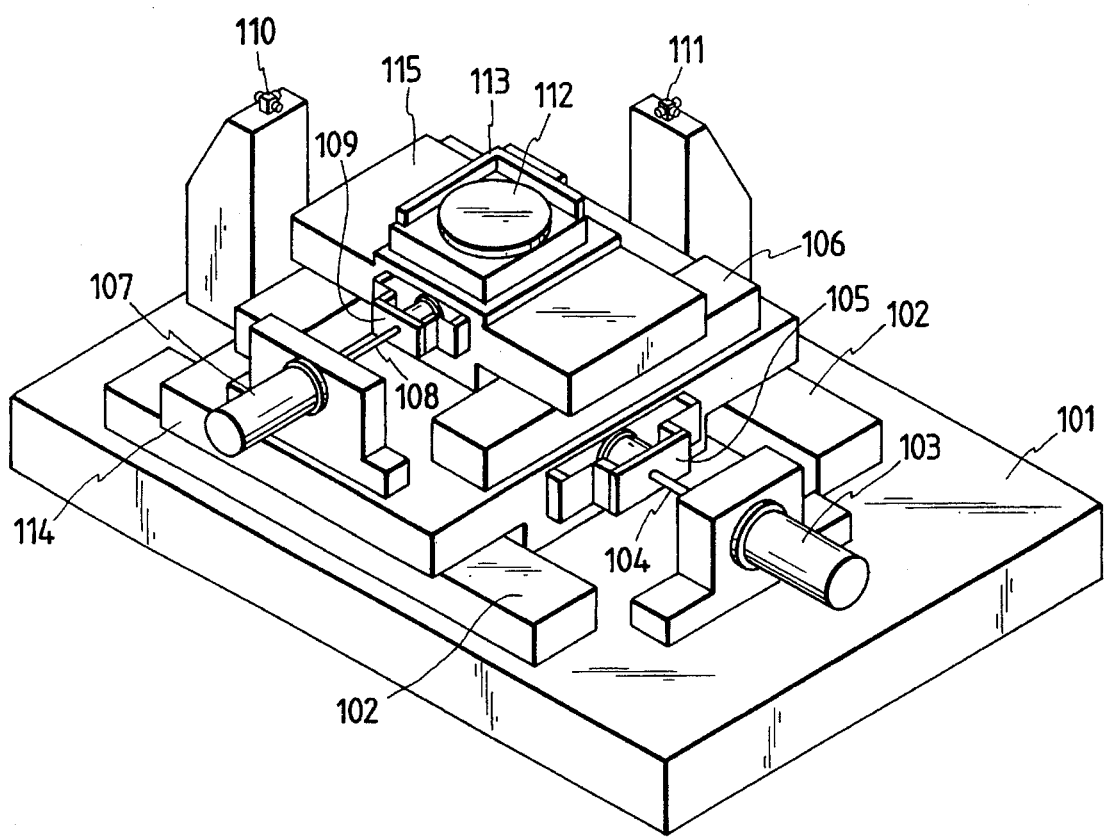
FIG. 8 is a perspective view showing the construction of a fourth embodiment of the present invention.

FIG. 8 is a perspective view showing the construction of a fourth embodiment of the present invention.

This embodiment is an X-ray exposure apparatus using synchrotron radiation as an exposure light source, and shows the construction of a stage used to move a wafer, a mask, etc. For the simplification of illustration, the wafer, the mask and an exposure optical system are not shown.

On top of a base 101, there are provided two parallel rail-like Y guides 102, a Y coarse movement expansible actuator unit 103, a Y laser interferometer 110 and an X laser interferometer 111.

A Y stage 114 movable in the lengthwise direction of the Y guides 102 is carried on the Y guides 102. On the Y stage 114, there are provided two parallel rail-like X guides 106 orthogonal to the Y guides 102 and an X coarse movement expansible actuator unit 107.

An X stage 115 movable in the lengthwise direction of the X guides 106 is carried on the X guides 106, and on this X stage 115, there are provided a wafer chuck 112 and a length measuring mirror 113 for laser interference for reflecting length measuring laser beams from the Y laser interferometer 110 and the X laser interferometer 111.

The Y coarse movement expansible actuator unit 103 is connected through a Y rod 104 to a Y fine movement actuator unit 105 provided on one end portion of the Y stage 114, and the X coarse movement expansible actuator unit 107 is connected through an X rod 108 to an X fine movement actuator unit 109 provided on one end portion of the X stage 115.

Each of the Y coarse movement expansible actuator unit 103 and the X coarse movement expansible actuator unit 107, like the coarse movement expansible actuator unit in the example of the prior art shown in FIG. 18, is a rotation-linear movement converting unit comprising an electric motor, an encoder, a gear, a ball nut, a screw and a bearing (all being not shown), and the Y rod 104 and X rod 108 expand or contract in response to the rotation of the electric motor to move the Y stage 114 and X stage 115, whereby coarse movement is effected.

Also, the Y coarse movement expansible actuator unit 103 and X coarse movement expansible actuator unit 107 are connected to a Y fine movement actuator unit 105 and an X fine movement actuator unit 109, respectively, and the fine movement control by these is effected after the above-described coarse movement control is terminated.

The supporting of the Y stage 114 by the Y guides 102 in the present embodiment and the supporting of the X stage 115 by the X guides 106 are effected by air bearings, but besides these, it wound occur to mind to use cross roller guides.

The position of the wafer chuck 112 relative to the base 101 is always measured by the Y laser interferometer 110 and the X laser interferometer 111, and on the basis of the result of this measurement, the above-mentioned coarse movement control and fine movement control are effected by a control device, not shown.

As each of the above-described coarse movement expansible actuator units, there is selected one having sufficient power so as to be able to step-move the load mass thereof by 30 mm within 0.3 second.

Figure 9:
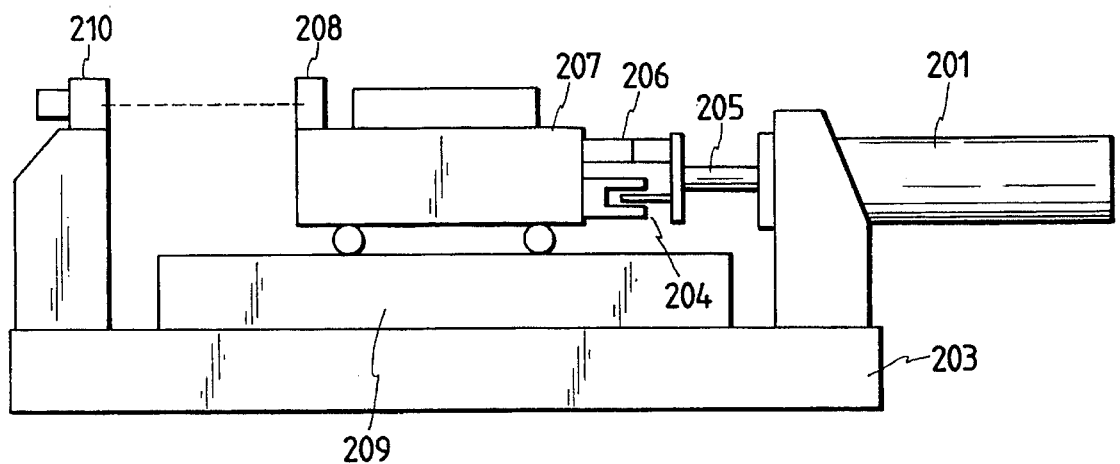
FIG. 9 is a side view showing in detail the construction of each fine movement actuator unit shown in FIG. 8.

FIG. 9 shows the concept of the construction of the X or Y stage shown in FIG. 8.

The fine movement actuator unit is provided between a rod 205 from a coarse movement expansible actuator unit 201 and a stage 207, and is comprised of a voice coil motor 204 and a clutch 206 provided in parallel.

As described above, the position of the stage 207 is always measured by a laser interferometer 210, and a length measuring mirror 208 for effecting this measurement is provided on the stage 207. The stage 207 is guided by a guide 209 with respect to a direction.

In the present embodiment, the clutch 206 is rendered into a connected state when the step movement by the coarse movement expansible actuator unit 201 is effected, and is rendered into a disconnected state when the step movement control is terminated and the precise positioning by the voice coil motor 204 is effected.

When the clutch 206 is in its disconnected state, the fine movement control by the voice coil motor 204 which is based on a length measurement signal from the laser interferometer 210 is effected.

Figure 10:
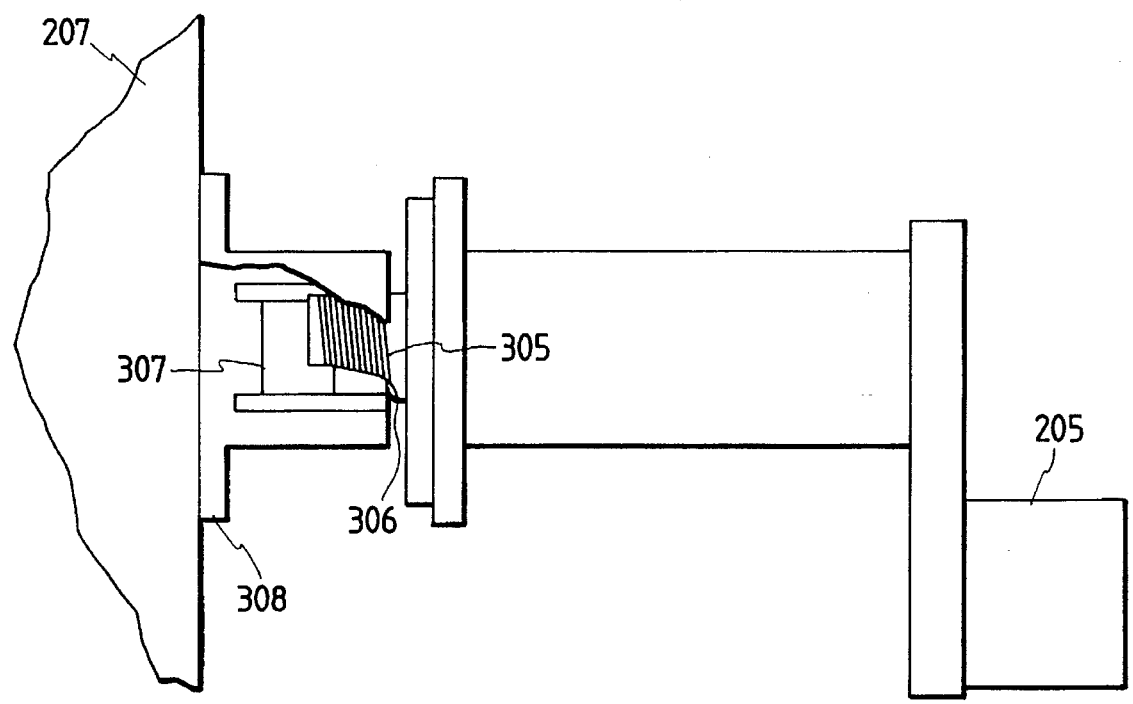
FIG. 10 is a side view partly in cross-section showing the structure of a vice coil motor 204 in a fine movement mechanism.
Figure 11:
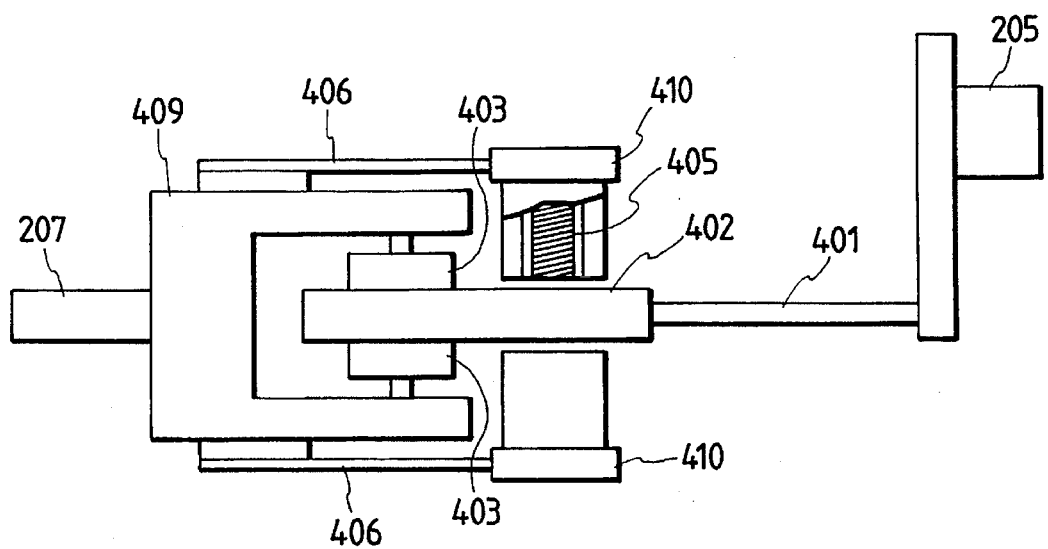
FIG. 11 is a side view partly in cross-section showing the structure of a clutch 206 in the fine movement mechanism.

FIGS. 10 and 11 are side views partly in cross-section showing the structure of the voice coil motor 204 and clutch 206 in the above-described fine movement mechanism.

The structure of the voice coil motor 204 will first be described with reference to FIG. 10.

The voice coil motor is provided between the rod 205 from the coarse movement expansible actuator and the stage 207 carrying a wafer, a mask, etc. thereon, and is comprised of a bobbin 306 for winding a coil 305 thereon, a permanent magnet 307 and a yoke 308 containing the permanent magnet 307 therein. The bobbin 306 and coil 305 are provided on the rod 303 side, and the permanent magnet 307 and yoke 308 are provided on the stage 301 side. Thus, design is made such that the thrust when an electric current is supplied to the coil 305 acts between the rod 303 and the stage 207.

The structure of the clutch 206 will now be described with reference to FIG. 11.

The clutch mechanism is comprised of a U-shaped frame member 409, an air pad 403 embracing a frictional plate 402 protruding from within the frame member 409 toward the open end thereof on the inner peripheral surface of the frame member 409, a leaf spring 406 extending from the outer peripheral surface of the frame member 409 toward the open end thereof, and an electromagnet unit 410 mounted on one end of the leaf spring 406 and containing a coil 405 therein.

The clutch constructed as described above is connected to the rod 205 of the coarse movement expansible actuator unit by a leaf spring 401, and the frame member 409 is mounted on the side of a movable member 408 which is the stage so as to control the transmission of the drive force of the coarse movement expansible actuator unit.

The operation of the clutch constructed as described above will now be described.

The frictional plate 402, as described above, is mounted on the rod 205 of the coarse movement expansible actuator unit through the leaf spring 401. The electromagnet unit 410 is mounted on the frame member 409 fixed to the movable member 408 side, through the leaf spring 406, and by an electric current being supplied to the coil 405, the leaf spring 406 in its deformed state is attracted to the frictional plate 402. When in this state, the rod 205 is moved, the drive force is transmitted to the stage 207 by the frictional force between the electromagnet unit 410 and the frictional plate 402. In a state in which no electric current is flowing to the coil 405, the electromagnet unit 410 and the frictional plate 402 are in their non-contact state and therefore, the drive force will not be transmitted even if the rod 205 is moved.

In the clutch mechanism constructed as described above, the air pad 403 is provided to properly keep the clearance between the frictional plate 402 and the electromagnet unit 410, and always causes the air to flow out, thereby constituting an air bearing between it and a portion of the frictional plate 402. Design is made such that when the postures of the driving member 407 and the movable member 408 side change, the leaf spring 401 is deformed by the thrust force of the above-described air bearing mechanism.

Each of the leaf springs 401 and 406 is of such a material and dimensions that they can transmit the drive force without being buckled by a force applied when the movable member 408 is moved.

Figure 12:
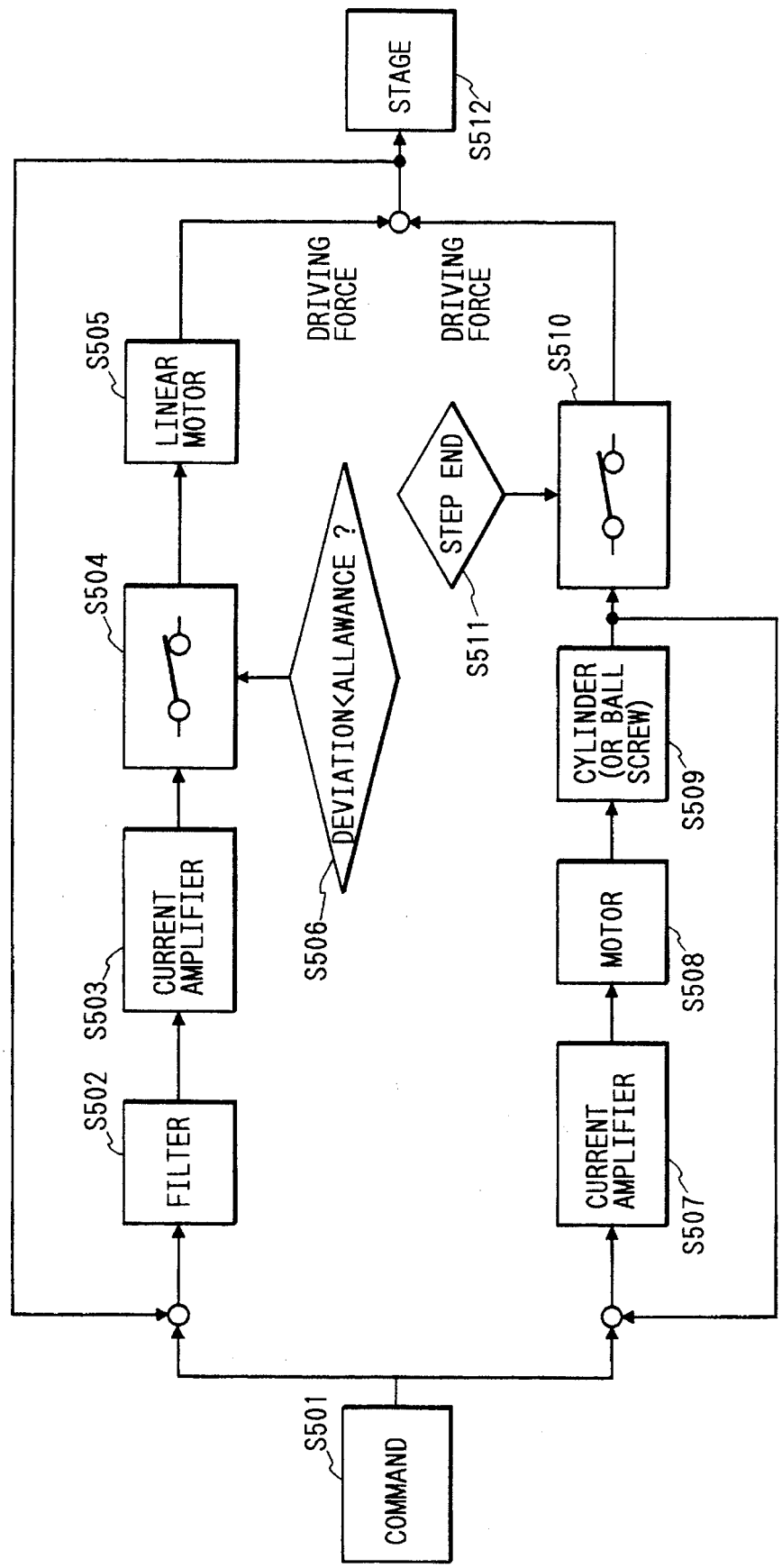
FIG. 12 is a block diagram showing the control operation of the fourth embodiment.

FIG. 12 is a block diagram showing the control operation of the present embodiment constructed as described above.

In FIG. 12, with regard to the fine movement actuator unit, the voice coil motor is a linear motor, and the commanding operation thereof is shown in the upper portion. Also, with regard to the coarse movement expansible actuator unit, it comprises a motor and a cylinder (or a ball screw) which are the constituents thereof, and the commanding operation thereof is shown in the lower portion.

During the coarse movement when the step movement by the coarse movement expansible actuator unit is effected, the clutch mechanism shown in FIG. 11 is rendered into a connected state.

The coarse movement expansible actuator unit is controlled on the basis of the amount of rotation of the motor measured by an encoder provided in the unit shown in FIG. 9, and the command is effected, for example, in the form of giving a continuous position command having a speed pattern. After predetermined step movement is effected by the command as described above, the clutch is disconnected and fine movement control is effected.

A current signal component included in the command is amplified by a current amplifier (S507), whereafter it is supplied to the motor (S508). Thereby the cylinder is expanded and contracted, and a thrust is given to the stage, whereby the movement of the stage is effected (S509). Thereafter, it is confirmed that the step movement has been completed (S511), and when the movement is confirmed, the clutch is disconnected (S510) and shift is made to the fine movement controlling operation.

A command value for effecting the movement is given to both of the coarse movement expansible actuator unit and the fine movement actuator unit (S501).

During the fine movement after the completion of the step movement by the fine movement actuator unit, the clutch mechanism shown in FIG. 11 is rendered into a disconnected state.

In the fine movement actuator unit, the current signal component included in the command is extracted by a filter (S502), and is amplified by a current amplifier (S503), whereafter it is delivered to a changeover switch 1. In the changeover switch 1, the limitation of the current to the linear motor is being effected (S504), and whether the supplied current value is within an allowable value is confirmed (S506), and if it is within the allowable value, the supply of the electric current to the linear motor is effected (S505). As a result, the driving force by the fine movement actuator is applied to the stage, whereby the movement control to a desired position is done (S512).

In the above-described embodiment, the position command has been described as being equally given to both of the coarse movement expansible actuator unit and the fine movement actuator unit, but alternatively, the position command may be divisionally given to the respective actuator units so that the driving by the fine movement actuator unit may be effected after the driving by the coarse movement expansible actuator unit is completed.

As described above, in the present embodiment, coarse movement control is effected with the clutch connected and therefore, the performance of the coarse movement expansible actuator unit is sufficiently secured, whereby rapid step movement can be effected. At this time, the heating of the actuator has little affects or the stage because the actuator is far from the stage.

Also, in the fine movement control effected thereafter, the driving force by the voice coil motor which is very high in positioning accuracy is directly applied to the stage and therefore, accurate positioning is possible. The voice coil motor does not directly transmit the driving force but transmits only the driving force and thus, during fine movement control in which the clutch is disconnected, the coarse movement expansible actuator unit becomes mechanically fully disconnected with respect to the direction of driving, and highly accurate and rapid positioning is effected without any disturbance being transmitted from the coarse movement expansible actuator unit. Also, in the fine movement control, the amount of driving is very small and therefore, the electric current supplied to the voice coil motor is little and the heating of the voice coil motor can be made little.

In the above-described embodiment, description has been made with the stage for effecting step movement taken as an example, but the present embodiment can also be applied to a scanning exposure stage for effecting exposure while scanning the stage. In scanning movement, a wafer or a mask on the stage is moved in the exposure area at a substantially equal scanning speed and therefore, an approach run area for accelerating before scanning movement is necessary.

Precise positioning is not necessary in this approach run area, but power for reaching a predetermined speed in a short time is necessary for the actuator. In contrast, during scanning exposure, precise positioning accuracy is necessary, but great power is not necessary.

Where the present embodiment is applied to a scanning exposure stage, the stage is accelerated by the coarse movement expansible actuator unit with the clutch connected during accelerated movement. After a scanning exposure state is attained, the clutch is disconnected and the stage is driven by the voice coil motor. During scanning movement, a movement command is also given to the coarse movement actuator so as to fall within the tolerance of operation of the clutch. This command is given in accordance with a predetermined data table by the utilization of an encoder. Alternatively, the current value of the voice coil motor may be monitored and the positional deviation of the voice coil motor, i.e., the relative distance between the rod of the coarse movement actuator and the stage, may be calculated from the current value, and control may be done so that this distance may fall within a predetermined range.

When the scanning movement of the exposure area is terminated, the clutch is again connected to thereby drive the coarse movement actuator and decelerate the stage. The above-described scanning can be realized by S511 in FIG. 12 being replaced with judgment as to whether scanning exposure is going on.

During the connection of the clutch, step movement is going on and therefore, the target position is greatly far from the stage position and a command value is given to the linear motor so that a great driving force may act thereon. Design is made such that at this time, a current limitation works and the changeover switch 1 operates so as to prevent useless electric current from flowing to the linear motor.

Description will now be made of an embodiment of a method of manufacturing a device utilizing an exposure apparatus provided with the above-described moving mechanism.

Figure 13:
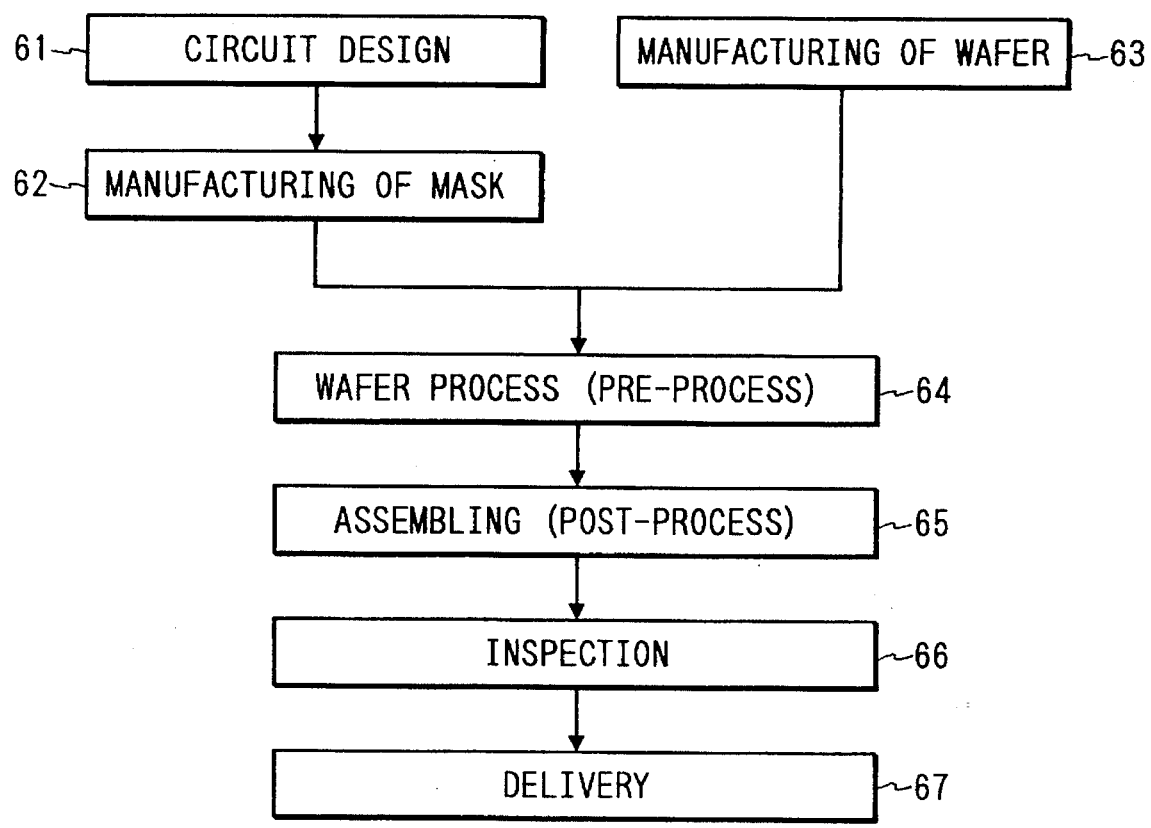
FIG. 13 is a flow chart showing the manufacturing process for a semiconductive device.

FIG. 13 is a flow chart showing a manufacturing process for a minute device (a semiconductive chip such as IC or LSI, a liquid crystal panel, a CCD, a thin film magnetic head, a micromachine or the like). At a step 61 (circuit design), the circuit design of the semiconductive device is effected. At a step 62 (the manufacturing of mask), a mask formed with the designed circuit pattern is manufactured. This mask is a reflection type mask and has the above-described feature. On the other hand, at a step 63 (the manufacturing of wafer), a wafer is manufactured by the use of a material such as silicon. A step 64 (wafer process) is called a pre-process, in which by the use of the manufactured mask and wafer, an actual circuit is formed on the wafer by the lithography technique. The next step 65 (assembling) is called a post-process which is a process for making the wafer manufactured at the step 64 into a semiconductive chip, and includes steps such as the assembling step (dicing and bonding) and the packaging step (enclosing the chip). At a step 66 (inspection), inspections such as the operation confirming test and durability test of the semiconductive device manufactured at the step 65 are carried out. Via such steps, the semiconductive device is completed, and it is delivered (step 67).

Figure 14:
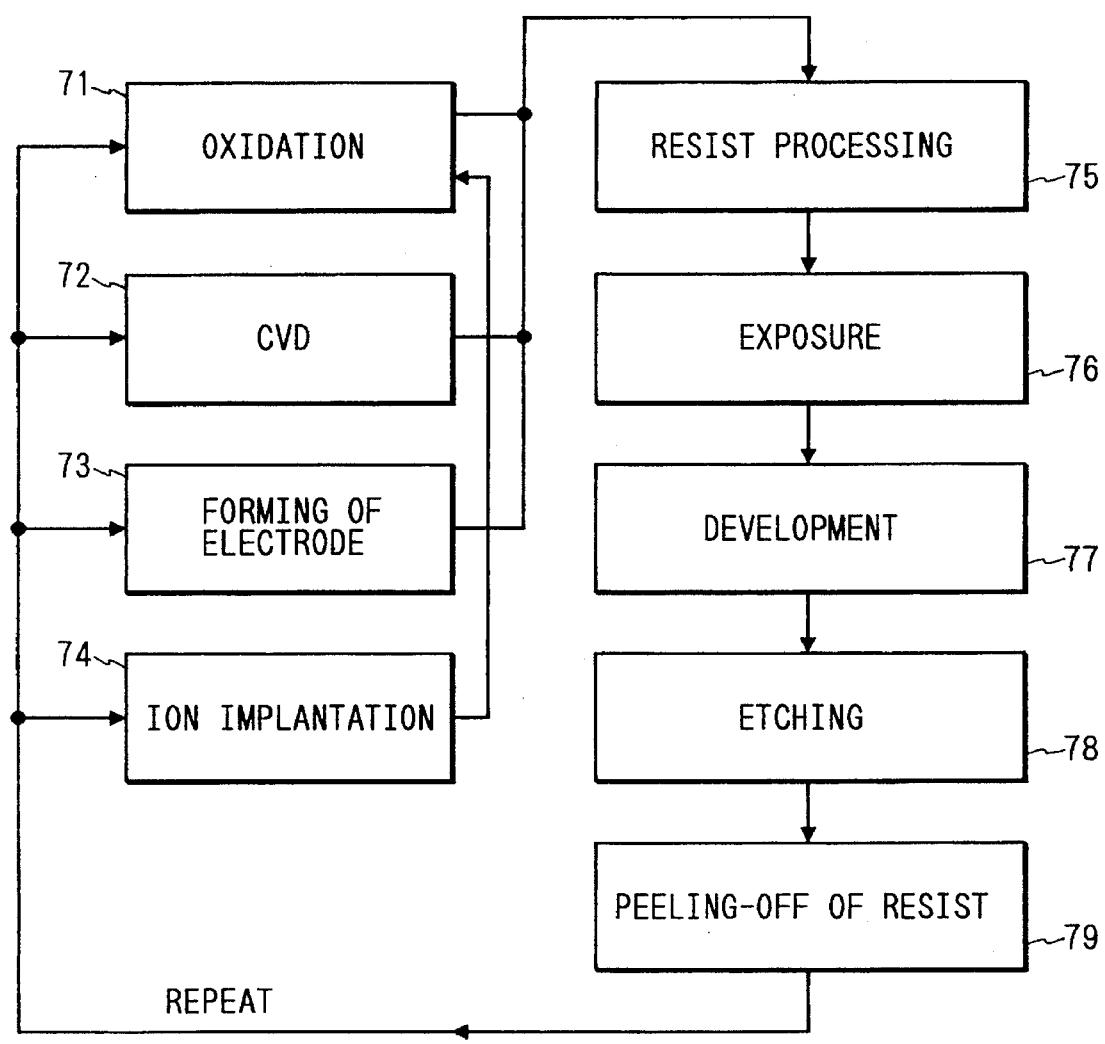
FIG. 14 is a flow chart showing the detailed steps of a wafer process.
Figure 15:
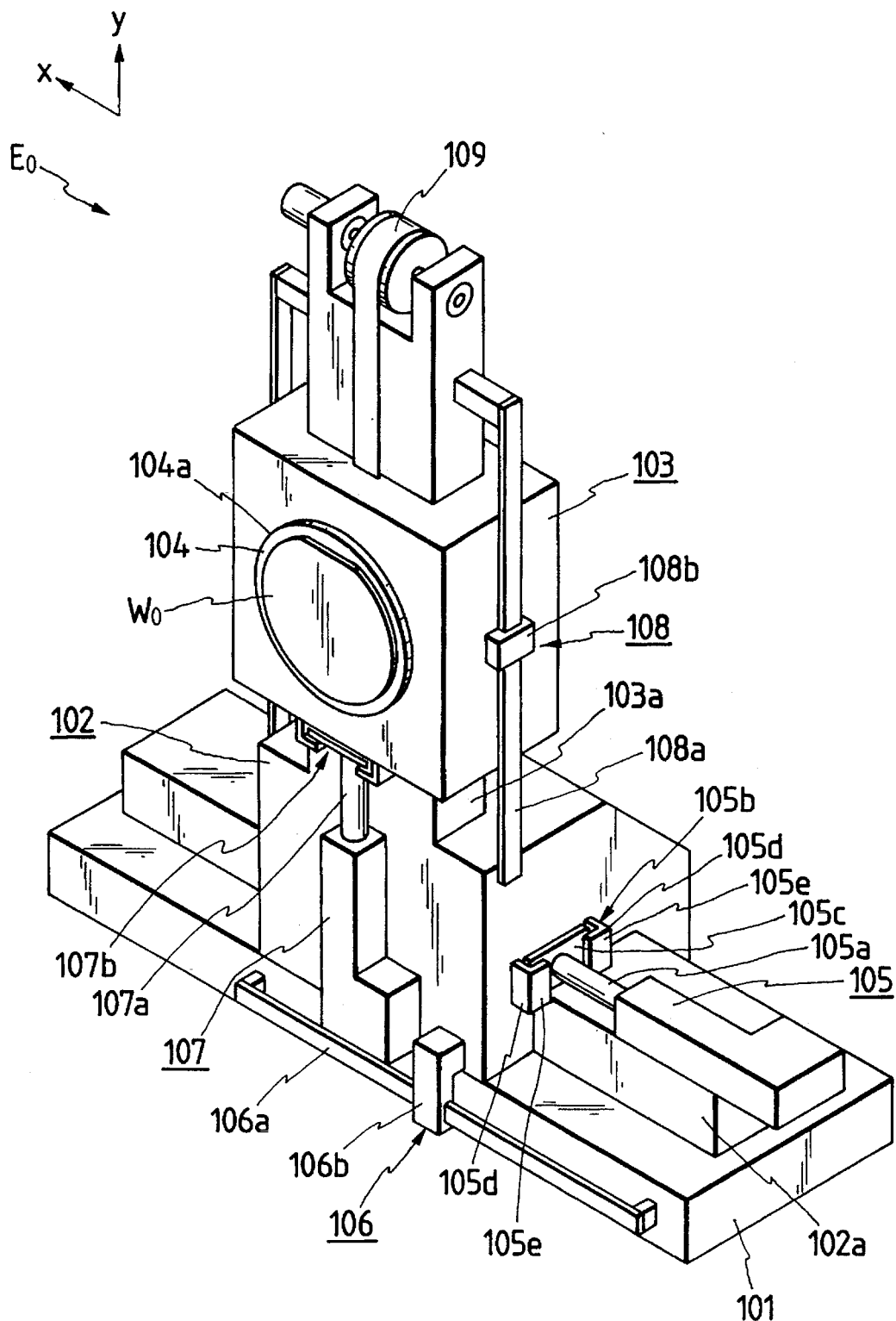
FIG. 15 is a perspective view showing an example of the prior art.
Figure 16:
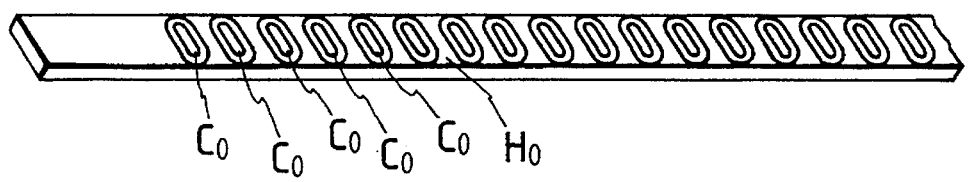
FIG. 16 is an enlarged fragmentary perspective view enlargedly showing a portion of a stator in the example of the prior art.
Figure 17:
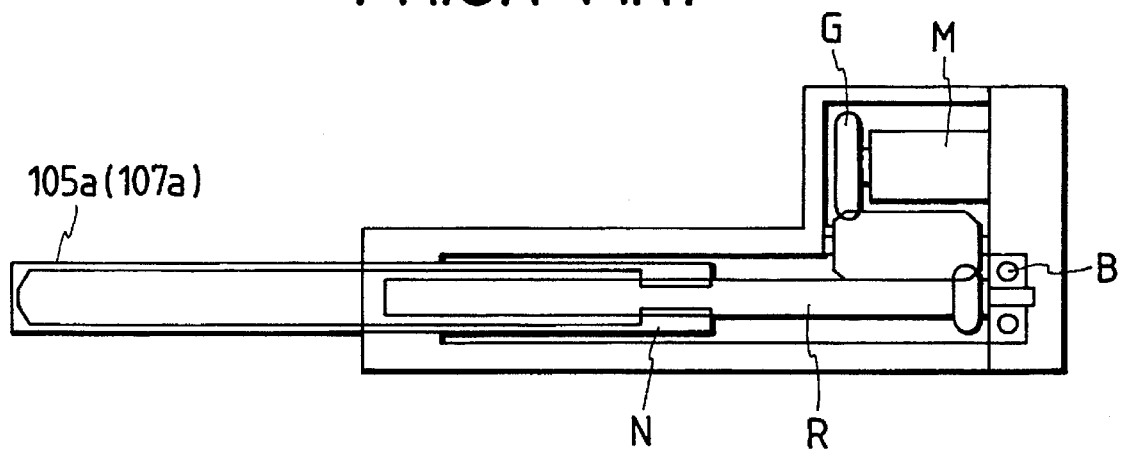
FIG. 17 is an illustration illustrating an electric cylinder.

FIG. 14 is a flow chart showing the detailed steps of the wafer process. At a step 71 (oxidation), the surface of the wafer is oxidized. At a step 72 (CVD), insulating film is formed on the surface of the wafer. At a step 73 (the forming of electrode), an electrode is formed on the wafer by vapor deposition. At a step 74 (ion implantation), ions are implanted into the wafer. At a step 75 (resist processing), photoresist is applied to the wafer. At a step 76 (exposure), the circuit pattern of the mask is printed and exposed onto the wafer by the mask and the exposure apparatus. At a step 77 (development), the exposed wafer is developed. At a step 78 (etching), the other portion than the developed resist image is scraped off. At a step 79 (the peeling-off of resist), the resist which has become unnecessary after the etching is removed. By repetitively carrying out these steps, circuit patterns are multiplexly formed on the wafer. If the manufacturing method of the present embodiment is used, it will be possible to manufacture semiconductive devices of a high degree of integration which have heretofore been difficult to manufacture.

What is claimed is:

1. A movable stage apparatus comprising:

a stage;

first driving means for moving said stage in a predetermined direction;

second driving means for moving said stage by a minute amount in the predetermined direction, wherein said second driving means connects said first driving means to said stage; and connecting means, provided between said first driving means and said stage, for transmitting a driving force of said first driving means to said stage not through said second driving means.

2. An apparatus according to claim 1, wherein said first driving means includes a cylinder.

3. An apparatus according to claim 1, wherein said second driving means includes a linear motor of a single coil.

4. An apparatus according to claim 1, wherein said second driving means includes a voice coil motor.

5. An apparatus according to claim 1, wherein said connecting means comprises a gap joint.

6. An apparatus according to claim 1, wherein said connecting means comprises a spring joint.

7. An apparatus according to claim 1, wherein said connecting means comprises a clutch.

8. An apparatus according to claim 1, wherein the predetermined direction is a substantially vertical direction.

9. An apparatus according to claim 1, wherein said first and second driving means are provided with respect to a first direction and a second direction orthogonal thereto, respectively, and two-dimensionally move said stage.

10. An apparatus according to claim 1, further comprising a chuck carried on said stage for holding a substrate.

11. An apparatus according to claim 10, wherein said substrate is a wafer to be exposed.

12. A movable stage apparatus comprising:

a stage;

first driving means for moving said stage in a predetermined direction;

second driving means for moving said stage by a minute amount in the predetermined direction;

third driving means for moving said stage in synchronism with said first driving means, wherein said second driving means connects said third driving means to said stage; and connecting means, provided between said first driving means and said stage, for transmitting a driving force of said first driving means to said stage not through said second driving means.

* * * * *

UNITED STATES PATENT AND TRADEMARK OFFICE
CERTIFICATE OF CORRECTION

PATENT NO. : 5,537,186
DATED : July 16, 1996
INVENTOR(S) : Korenaga, et al.

Page 1 of 2

It is certified that error appears in the above-indentified patent and that said Letters Patent is hereby corrected as shown below:

On the title page item,
[75]  INVENTORS:

"Nobushige Korenaga," should read --Nobusige Korenaga,--.

SHEET 8:

FIG. 12, "ALLAWANCE" should read --ALLOWANCE--.

COLUMN 3:

Line 66, "vice" should read --voice--.

COLUMN 7:

Line 32, "diving" should read --driving--.

COLUMN 8:

Line 31, "caried" should read --carried--.
Line 63, "wound" should read --would--.

UNITED STATES PATENT AND TRADEMARK OFFICE
CERTIFICATE OF CORRECTION

PATENT NO.  : 5,537,186
DATED       : July 16, 1996
INVENTOR(S) : Korenaga, et al.

It is certified that error appears in the above-indentified patent and that said Letters Patent is hereby corrected as shown below:

COLUMN 11:

Line 10, "both of" should read --both--.
Line 22, "affects or" should read --affect on--.

Signed and Sealed this

First Day of April, 1997

Attest:

BRUCE LEHMAN

Attesting Officer

Commissioner of Patents and Trademarks